May 28, 1968 G. S. ENTWISTLE 3,386,034

RADIO FREQUENCY SIGNAL LEVEL CONTROL CIRCUIT

Filed Nov. 12, 1964 2 Sheets-Sheet 1

INVENTOR
Geoffrey S. Entwistle
BY Ernest P. Klipfel
ATTORNEY 3,386,034
Patented May 28, 1968

3,386,034
RADIO FREQUENCY SIGNAL LEVEL CONTROL CIRCUIT

Geoffrey S. Entwistle, Severna Park, Md., assignor to Westinghouse Electric Corporation, East Pittsburgh, Pa., a corporation of Pennsylvania Filed Nov. 12, 1964, Ser. No. 410,564
1 Claim. (Cl. 325—415)

ABSTRACT OF THE DISCLOSURE

A signal level control circuit for RF frequency signals by varying the magnitude of temperature responsive resistors in accordance with a control signal. The temperature responsive resistors are connected in the series and parallel circuit combinations between the input means and output means. First and second control circuits provide current to the temperature responsive resistors for varying their temperature and hence the magnitude of their resistance in the signal level control circuit.

The present invention relates generally to attenuators and more particularly to an attenuator for signals at radio frequencies.

Automatic signal-level control is usually used in radio communications receivers. Most commonly one or more amplifying stages are used to provide signal level control by varying the steady state bias to change the gain of each stage. In many instances, the desired gain variation is accompanied by non-linearity which gives unacceptable intermodulation of the signal and accompanying interference. The use of non-linear impedance devices such as diodes also results in intermodulation and distortion since the impedance of the diode is responsive to the RF signal to be attenuated by the cascaded stages. A comparatively costly alternative is to use a servo-controlled attenuator in tandem with the receiver.

An object of the present invention is to provide a radio frequency attenuator which is highly linear, in the sense of low signal distortion and intermodulation.

Another object of the present invention is to provide a circuit capable of virtually independent attenuation of signal level for amplitudes heretofore unavailable.

Another object of the present invention is to provide an attenuator for signal level control at higher frequencies than heretofore available.

Another object of the present invention is to provide a static radio frequency attenuator.

Another object of the present invention is to provide a radio frequency attenuator capable of operation over a wide range of ambient temperature.

Another object of the present invention is to provide a radio frequency attenuator having a bandwidth equal to or greater than 30% of the center frequency.

Another object of the present invention is to provide a signal level control circuit for radio frequencies wherein the response time constant of each section that is cascaded may be as short as a few milliseconds or as long as several seconds.

Briefly, the present invention provides a signal level control circuit for RF frequency signals by varying the magnitude of temperature responsive resistors in accordance with a control signal. The temperature response time-constant of the resistors can be selected to be substantially greater than the period of frequency of the signal to be attenuated. In such a manner the impedance of each cascaded stage is not responsive to the propagation of the RF frequency signal. Since the temperature responsive resistor has a response time-constant substantially larger than the period of the radio frequency signal to be attenuated, the change of impedance in a stage over a cycle of the RF signal is very small. Hence, no intermodulation or distortion occurs.

These and other objects of the present invention will be more readily apparent from the following detailed description taken in conjunction with the drawing, in which.

Figure 1:
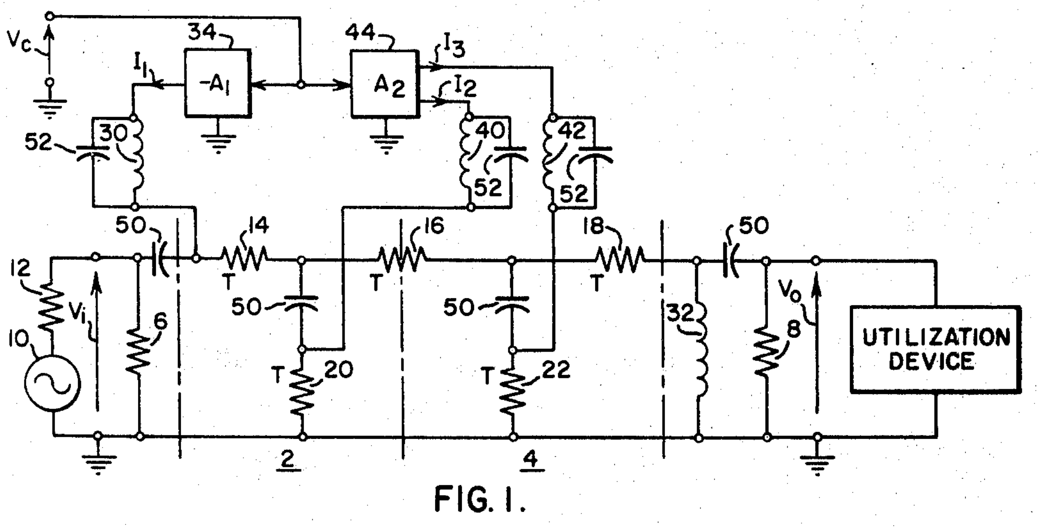
FIGURE 1 is an electrical schematic diagram of an illustrative embodiment of the present invention.

Referring to FIG. 1, a signal level control circuit of two stages 2 and 4, preceded by an input impedance 6 and followed by an output impedance 8, is connected to attenuate an RF signal $V_i$ from a signal source 10 having a source impedance 12. Temperature responsive resistors such as, for example, negative temperature coefficient resistors 14, 16 and 18 are serially connected between the input means 6 and output means 8 while temperature responsive resistors 20 and 22 are parallelly connected as in a ladder network. It is to be understood, however, that any suitable network configuration may be used.

Input resistor 6 and output resistor 8 are included to match the impedance of the attenuator approximately to the source and load impedances. When desired, one or both ends may be operated unmatched for reduced minimum insertion loss.

A control circuit varies the resistance of each cascaded stage to attenuate the RF signal as it propagates through the circuit. The series connected thermistors 14, 16 and 18 are controlled with a direct control current $I_1$ fed through isolating inductors 30 and 32 from an amplifier 34. The amplifier 34, which may be of any suitable type such as a common emitter transistor amplifier, has a negative gain characteristic to provide decreasing current $I_1$ in response to a signal for increased attenuation.

The parallelly disposed thermistors 20 and 22 are controlled by direct control currents $I_2$ and $I_3$ respectively fed through isolating inductors 40 and 42 from another amplifier 44. The control amplifier 44 provides increasing currents $I_2$, $I_3$ in response to control signal $V_c$ for increased attenuation.

It can be shown that attenuation by the circuit is directly proportional to the magnitude of resistance of the series thermistors 14, 16 and 18 and inversely proportional to the magnitude of resistance of the shunt connected thermistors 20 and 22.

Figure 2:
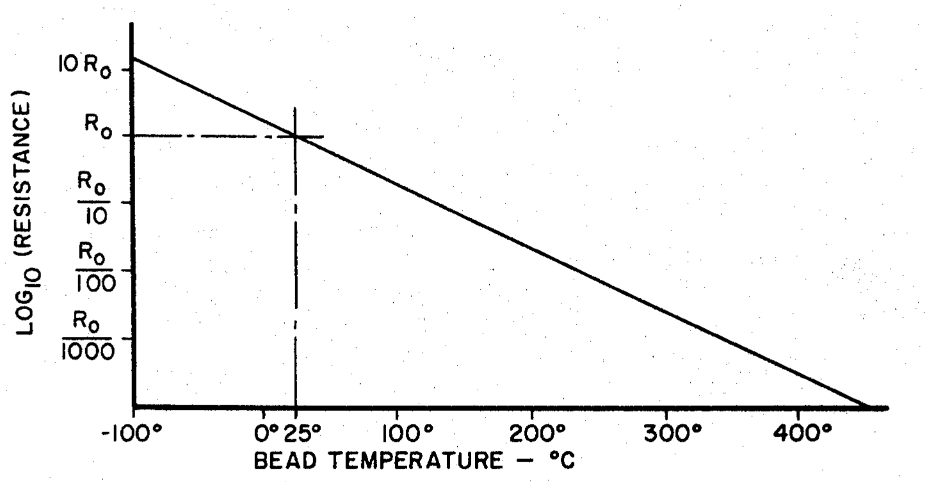
FIG. 2 is a characteristic curve of an element utilized in the illustrative embodiment of FIG. 1.

Assume that the thermistors have a resistance-temperature characteristic of the type illustrated in FIG. 2; namely, a negative temperature coefficient. With a decreasing control current $I_1$ the temperature of the series connected thermistors 14, 16 and 18 will decrease thereby increasing the magnitude of their resistance and hence increase attenuation. In response to the same signal $V_c$ for increased attenuation the control amplifier 44 will provide increasing currents $I_2$ and $I_3$ thus increasing the temperature of the parallelly disposed thermistors 20 and 22, reducing the magnitude of their resistance and increasing attenuation.

Isolating capacitors 50 prevent shorting of the control current paths. Isolating inductors 30, 32, 40 and 42 prevent loss of the RF signal to, or coupling through, the control amplifiers 34 and 44. Control capacitors 52 may be required across the isolating inductors for tuning to provide the correct signal frequency response. In some cases, the isolating inductors may be replaced by more elaborate filter networks to achieve an adequate signal frequency response.

The signal load control circuit of FIG. 1 may be operated at radio frequencies from below 100 kilocycles per second to approximately 500 megacycles per second with signal bandwidths up to 30% of the center frequency. Wider bandwidths may be attained if the isolating inductors are replaced by more elaborate filter networks. The attenuation per controlled section depends on the resistance variation permitted in the thermistors. FIG. 2 shows a typical resistance-temperature characteristic for a bead thermistor. A bead thermistor is used becasue of a very small stray capacitance which gives little signal breakthrough except at very high frequencies or in high-impedance attenuators. A variance in bead temperature from 50° C. to 350° C. provides approximately a 100:1 variation in resistance. This results in about 20 to 30 db variation in insertion loss for each thermistor. The input impedance and output impedance of the circuit will also vary in response to the resistance variation of the thermistors. Hence, the allowable variation in resistance of the thermistors may be limited to maintain the input or output impedance approximately constant.

Figure 3:
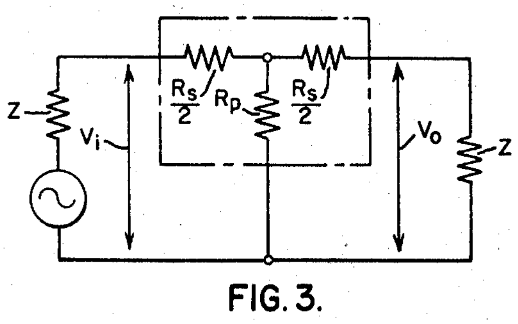
FIG. 3 is an electrical schematic diagram useful in understanding the operation of an alternate embodiment of the present invention.

Since the resistance characteristic of the thermistors is known, the ratios of the magnitudes of resistance of the series thermistors to the shunt thermistors can be advantageously controlled to maintain the input and output impedance of the network constant. The control amplifiers 34 and 44 need merely be chosen to have non-linear gain characteristics to compensate for changes in the input and output impedances. For example, the symmetrical T section of FIG. 3 attenuating with an impedance Z has a shunt arm $$R_{\text{shunt}}=\frac{Z}{\sin h(\theta)}=\frac{2ZV_iV_0}{V_i^2-V_0^2}$$

and series arm $$R_{\text{series}}=Z\tan h\left(\frac{\theta}{2}\right)=\frac{Z(V_i-V_0)}{V_i+V_0}$$

where $\theta$ is the attenuation constant per stage in nepers, and is the natural log $V_0/V_1$ per stage. However, such an arrangement for providing current to the thermistors in a non-linear manner to vary temperature is often not necessary because a reasonable impedance tolerance can be obtained by the use of the shunt matching resistors 6 and 8 shown in FIG. 1. Such input and output resistors dampen out the variation of impedance per stage and hence hold the input and output impedance more constant. When desired, series resistors may be used to accomplish the same result. Typical minimum insertion loss would be in the order of 8 to 15 db.

Figure 4:
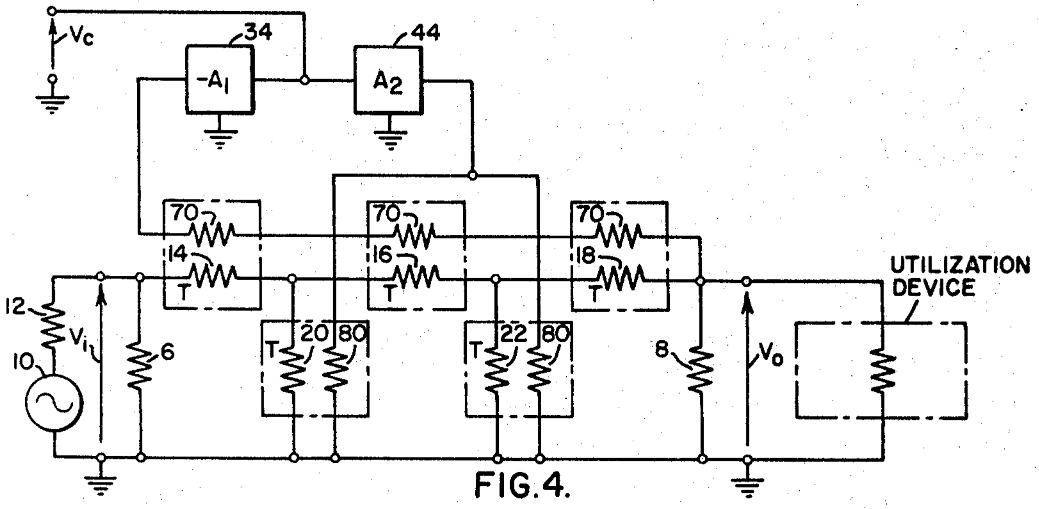
FIG. 4 is an electrical schematic diagram of yet another alternate embodiment of the present invention.

Bead thermistors are very small and have time constants of a few milliseconds. Their use with direct heating by the control current as shown in FIG. 1 provides an attenuator with a response time much less than one second. FIG. 4 shows an alternate embodiment of the present invention wherein the control circuit is isolated from the signal network. Similar items have been designated by the same reference characters used in FIG. 1. Indirectly heated bead thermistors have a time constant of the order of 1 second, giving slower attenuation action and allowing signal frequencies from 10 kc./s. to 100 kc./s. to be used without the distortion which would result if directly heated thermistors were used. More specifically, heater windings 70 for the series connected thermistors 14, 16 and 18 and heater windings 80 for the parallelly disposed thermistors 20 and 22 may be of a few hundred ohms resistance and wound about an insulating sleeve encasing the bead thermistor. The isolation between the control circuit and the signal network makes filtering and decoupling of the control circuit generally easier. The capacitors 50 and inductors 30, 32, 40 and 42 are eliminated from the signal attenuator network. The circuit of FIG. 4 will provide satisfactory results except at very high frequencies when coupling through stray capacitance from the thermistor bead to the heater coil and between wires could result. An AC control current can be advantageously utilized when the control circuit is isolated from the signal attenuator circuit.

The long time-constant of the thermistors with respect to signal frequency allows a signal attenuator circuit which is highly linear, in the sense of low signal distortion and intermodulation, for signal levels up to an input power of 10 milliwatts, even at 100 kilocycles per second signal frequency. The attenuation is virtually independent of the signal level up to an input power of 1 milliwatt. When the RF signal to be attenuated is of higher amplitude, the impedance of the thermistors within the cascaded attenuator stages may be affected by current resulting from the magnitude of the signal and cause the attenuation value to be changed. The attainable linearity utilizing thermistors of a time constant equal to 5 milliseconds can have a response, for example, such that the distortion products are 70 db below the signal level at a signal frequency of 100 kilocycles per second.

The circuit bandwidth is limited only by the filtering of a control current circuit. With directly-heated thermistors, bandwidths of the order of 30% of the center frequency are possible up to 500 megacycles per second. Indirectly heated thermistors allow very wide signal bandwidths at requencies where the capacitance coupling of the bead to the heater winding is not important.

The availablity of thermistors having a response time-constant as short as a few milliseconds or as long as several seconds allows the selection of temperature responsive resistors which will alter their resistance very little over a full cycle of the RF signal. Since the resistance of the thermistor does not appreciably change over the period of the RF frequency signal, the response of the signal attenuator circuits remains linear and distortion products are not generated.

While the present invention has been described with a degree of particularity for the purposes of illustration, it is understood with all modifications, alterations and the substitutions within the spirit and scope of the present invention are herein meant to be included. For example, either the series disposed or shunt disposed thermistors may be replaced by fixed resistance elements, enabling one control amplifier 34 or 44 to be eliminated, with reduced range of control. The use of non-linear gain characteristic amplifiers so that the control currents will vary in such a manner that the shunt resistance and series resistance per amplifier stage will adjust to provide a constant input and/or output impedance has been described previously with respect to FIG. 3. While bead type thermistors are preferred, it is to be understood that other type thermistors may be utilized. Positive temperature coefficient thermistors may be used with appropriate polarity changes in the control circuit.

I claim as my invention:

1. A signal level control circuit for radio frequencies comprising, in combination; a plurality of cascaded attenuating sections each including a series connected temperature responsive resistor and a parallel connected temperature responsive resistor; input means operably connected to a first stage for receiving an RF signal for attenuation; output means operably connected to the last stage for connecting the attenuated signal to a utilization device; a first control circuit including a first amplifier, a first inductance means and said series connected temperature responsive resistors connected in series circuit combination; a second control circuit including a second amplifier and second inductance means connected to said parallel connected temperature responsive resistors in series circuit combination; said first amplifier and said second amplifier providing current to its associated circuit combination in response to a control signal for varying the temperature of the temperature responsive resistors in its associated circuit combination to change the magnitude of their resistance.

References Cited

UNITED STATES PATENTS

| | | | |
|---|---|---|---|
| 2,660,625 | 11/1953 | Harrison | 333—81 XR |
| 2,811,695 | 10/1957 | Drexler | 333—17 |

KATHLEEN H. CLAFFY, *Primary Examiner.*

R. LINN, *Assistant Examiner.*